United States Patent
Yu et al.

(10) Patent No.: US 10,177,104 B2
(45) Date of Patent: Jan. 8, 2019

(54) PACKAGE ON PACKAGE STRUCTURE AND METHOD FOR FORMING THE SAME

(71) Applicant: Taiwan Semiconductor Manufacturing Co., Ltd., Hsin-Chu (TW)

(72) Inventors: Chen-Hua Yu, Hsinchu (TW); Chung-Shi Liu, Hsinchu (TW); Ming-Da Cheng, Jhubei (TW); Mirng-Ji Lii, Sinpu Township (TW); Meng-Tse Chen, Changzhi Township (TW); Wei-Hung Lin, Xinfeng Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 1 day.

(21) Appl. No.: 15/631,436

(22) Filed: Jun. 23, 2017

(65) Prior Publication Data
US 2017/0287865 A1    Oct. 5, 2017

Related U.S. Application Data

(60) Continuation of application No. 14/975,911, filed on Dec. 21, 2015, now Pat. No. 9,711,470, which is a (Continued)

(51) Int. Cl.
*H01L 23/00* (2006.01)
*H01L 23/31* (2006.01)
(Continued)

(52) U.S. Cl.
CPC ............ *H01L 24/05* (2013.01); *B23K 35/001* (2013.01); *B23K 35/0222* (2013.01);
(Continued)

(58) Field of Classification Search
CPC . H01L 2224/13582; H01L 2224/13016; H01L 2224/13017; H01L 2224/08057; H01L 2224/08058
See application file for complete search history.

(56) References Cited

U.S. PATENT DOCUMENTS 5,841,198 A * 11/1998 Chia .................. H01L 23/3128
257/780
6,011,312 A     1/2000 Nakazawa et al.
(Continued)

FOREIGN PATENT DOCUMENTS

| EP | 1551211 A1 | 7/2005 |
| TW | 530344 B | 5/2003 |
| TW | 201110246 A | 3/2011 |

OTHER PUBLICATIONS

Non-Final Office Action dated Aug. 28, 2013 for U.S. Appl. No. 13/526,073.
(Continued)

*Primary Examiner* — Tom Thomas
*Assistant Examiner* — John Bodnar
(74) *Attorney, Agent, or Firm* — Eschweiler & Potashnik, LLC

(57) ABSTRACT

Some embodiments relate to a semiconductor device package, which includes a substrate with a contact pad. A non-solder ball is coupled to the contact pad at a contact pad interface surface. A layer of solder is disposed over an outer surface of the non-solder ball, and has an inner surface and an outer surface which are generally concentric with the outer surface of the non-solder ball. An intermediate layer separates the non-solder ball and the layer of solder. The intermediate layer is distinct in composition from both the non-solder ball and the layer of solder. Sidewalls of the layer of solder are curved or sphere-like and terminate at a planar
(Continued)

surface, which is disposed at a maximum height of the layer of solder as measured from the contact pad interface surface.

20 Claims, 7 Drawing Sheets

Related U.S. Application Data division of application No. 13/526,073, filed on Jun. 18, 2012, now Pat. No. 9,219,030.

(60) Provisional application No. 61/624,928, filed on Apr. 16, 2012.

(51) Int. Cl.
| | |
|---|---|
| *H01L 25/065* | (2006.01) |
| *H01L 23/498* | (2006.01) |
| *H01L 21/56* | (2006.01) |
| *H01L 25/10* | (2006.01) |
| *H01L 25/03* | (2006.01) |
| *H01L 25/00* | (2006.01) |
| *B23K 35/00* | (2006.01) |
| *B23K 35/02* | (2006.01) |
| *B23K 35/22* | (2006.01) |
| *B23K 35/26* | (2006.01) |
| *B23K 35/36* | (2006.01) |

(52) U.S. Cl.
CPC ............ *B23K 35/22* (2013.01); *B23K 35/262* (2013.01); *B23K 35/3613* (2013.01); *H01L 21/561* (2013.01); *H01L 23/3135* (2013.01); *H01L 23/3178* (2013.01); *H01L 23/498* (2013.01); *H01L 23/49816* (2013.01); *H01L 24/08* (2013.01); *H01L 24/13* (2013.01); *H01L 24/14* (2013.01); *H01L 24/16* (2013.01); *H01L 24/17* (2013.01); *H01L 24/81* (2013.01); *H01L 24/94* (2013.01); *H01L 24/97* (2013.01); *H01L 25/03* (2013.01); *H01L 25/0652* (2013.01); *H01L 25/105* (2013.01); *H01L 25/50* (2013.01); *H01L 2224/0401* (2013.01); *H01L 2224/05022* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/05166* (2013.01); *H01L 2224/05184* (2013.01); *H01L 2224/05572* (2013.01); *H01L 2224/05611* (2013.01); *H01L 2224/06181* (2013.01); *H01L 2224/08113* (2013.01); *H01L 2224/1184* (2013.01); *H01L 2224/13005* (2013.01); *H01L 2224/136* (2013.01); *H01L 2224/13014* (2013.01); *H01L 2224/13022* (2013.01); *H01L 2224/13023* (2013.01); *H01L 2224/13026* (2013.01); *H01L 2224/1355* (2013.01); *H01L 2224/1357* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13184* (2013.01); *H01L 2224/13561* (2013.01); *H01L 2224/13582* (2013.01); *H01L 2224/13666* (2013.01); *H01L 2224/1412* (2013.01); *H01L 2224/14181* (2013.01); *H01L 2224/16104* (2013.01); *H01L 2224/16145* (2013.01); *H01L 2224/16225* (2013.01); *H01L 2224/16227* (2013.01); *H01L 2224/1703* (2013.01); *H01L 2224/17051* (2013.01); *H01L 2224/48091* (2013.01); *H01L 2224/48227* (2013.01); *H01L 2224/81815* (2013.01); *H01L 2224/94* (2013.01); *H01L 2224/97* (2013.01); *H01L 2225/0651* (2013.01); *H01L 2225/06513* (2013.01); *H01L 2225/06541* (2013.01); *H01L 2225/06565* (2013.01); *H01L 2225/06568* (2013.01); *H01L 2225/1023* (2013.01); *H01L 2225/1058* (2013.01); *H01L 2924/00014* (2013.01); *H01L 2924/014* (2013.01); *H01L 2924/12042* (2013.01); *H01L 2924/1305* (2013.01); *H01L 2924/1306* (2013.01); *H01L 2924/13091* (2013.01); *H01L 2924/15311* (2013.01); *H01L 2924/181* (2013.01); *H01L 2924/381* (2013.01); *H01L 2924/3841* (2013.01)

(56) References Cited

U.S. PATENT DOCUMENTS

| | | | |
|---|---|---|---|
| 6,109,507 A | 8/2000 | Yagi et al. | |
| 6,111,317 A | 8/2000 | Okada et al. | |
| 6,333,563 B1 | 12/2001 | Jackson et al. | |
| 6,337,445 B1 | 1/2002 | Abbott et al. | |
| 6,518,667 B1* | 2/2003 | Ichida | ............... H01L 23/49816 257/734 |
| 6,781,065 B1 | 8/2004 | Palmteer | |
| 9,219,030 B2 | 12/2015 | Yu et al. | |
| 2002/0151164 A1 | 10/2002 | Jiang et al. | |
| 2004/0262778 A1* | 12/2004 | Hua | ........................ H01L 24/81 257/778 |
| 2006/0035453 A1 | 2/2006 | Kim et al. | |
| 2006/0055054 A1 | 3/2006 | Kondo et al. | |
| 2009/0096095 A1 | 4/2009 | Ishido | |
| 2009/0146314 A1 | 6/2009 | Akaike et al. | |
| 2009/0184407 A1 | 7/2009 | Arvin et al. | |
| 2009/0256256 A1* | 10/2009 | Meyer | ..................... H01L 24/13 257/738 |
| 2010/0078789 A1 | 4/2010 | Choi et al. | |
| 2010/0084765 A1 | 4/2010 | Lee et al. | |
| 2010/0193936 A1 | 8/2010 | Tanie et al. | |
| 2010/0244216 A1 | 9/2010 | Huang et al. | |
| 2011/0026232 A1 | 2/2011 | Lin et al. | |
| 2011/0272807 A1 | 11/2011 | Park et al. | |
| 2012/0074566 A1* | 3/2012 | Youn | ...................... H01L 25/16 257/738 |
| 2013/0221522 A1 | 8/2013 | Chen et al. | |
| 2014/0008792 A1 | 1/2014 | Pendse | |

OTHER PUBLICATIONS

Final Office Action dated Feb. 26, 2014 for U.S. Appl. No. 13/526,073.
Non-Final Office Action dated Oct. 31, 2014 for U.S. Appl. No. 13/526,073.
Final Office Action dated Apr. 9, 2015 for U.S. Appl. No. 13/526,073.
Notice of Allowance dated Aug. 3, 2015 for U.S. Appl. No. 13/526,073.
Non-Final Office Action dated Jul. 15, 2016 for U.S. Appl. No. 14/975,911.
Final Office Action dated Dec. 14, 2016 for U.S. Appl. No. 14/975,911.
Notice of Allowance dated Mar. 7, 2017 for U.S. Appl. No. 14/975,911.

* cited by examiner

PACKAGE ON PACKAGE STRUCTURE AND METHOD FOR FORMING THE SAME

REFERENCE TO RELATED APPLICATIONS

This Application is a Continuation of U.S. application Ser. No. 14/975,911 filed on Dec. 21, 2015, which is a Divisional of U.S. application Ser. No. 13/526,073 filed on Jun. 18, 2012 (now U.S. Pat. No. 9,219,030 issued on Dec. 22, 2015), which claims priority to U.S. Provisional Application No. 61/624,928 filed on Apr. 16, 2012. The contents of the above-referenced matters are hereby incorporated by reference in their entirety.

This application relates to the following and commonly assigned patent application Ser. No. 13/406,031, entitled "Mechanisms of Forming Connectors for Package on Package" and filed on Feb. 27, 2012, which is incorporated herein in its entirety.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of materials over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area and/or lower height than packages of the past, in some applications.

Thus, new packaging technologies, such as package on package (PoP), have begun to be developed, in which a top package with a device die is bonded to a bottom package with another device die. By adopting the new packaging technologies, the integration levels of the packages may be increased. These relatively new types of packaging technologies for semiconductors face manufacturing challenges.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Figure 1A:
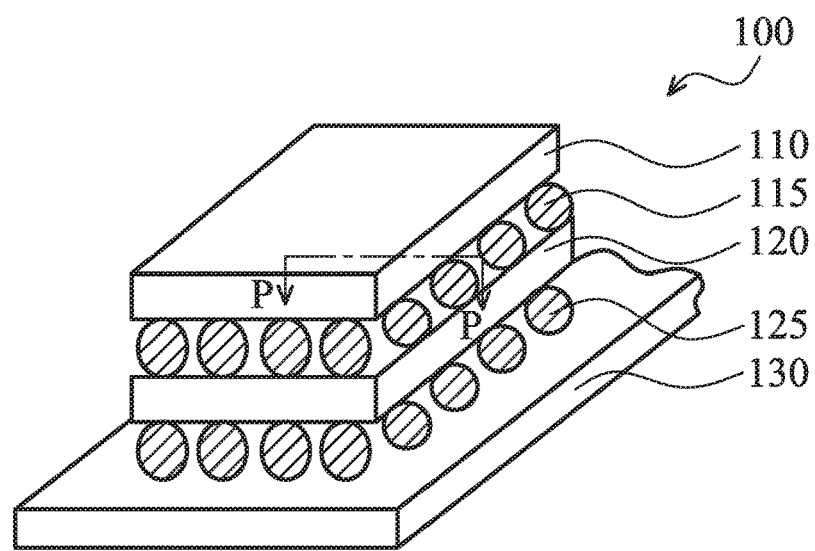
FIG. 1A shows a perspective view of a package, in accordance with some embodiments.

FIG. 1A shows a perspective view of a package assembly 100 having a package 110 bonded to another package 120, which is further bonded to a substrate 130 in accordance with some embodiments. Each package, such as package 110 or package 120, includes at least a semiconductor die (not shown). The semiconductor die includes a substrate as employed in a semiconductor integrated circuit fabrication, and integrated circuits may be formed therein and/or thereupon. The semiconductor substrate is defined to mean any construction comprising semiconductor materials, including, but not limited to, bulk silicon, a semiconductor wafer, a silicon-on-insulator (SOI) substrate, or a silicon germanium substrate. Other semiconductor materials including group III, group IV, and group V elements may also be used. The substrate 130 may further comprise a plurality of isolation features (not shown), such as shallow trench isolation (STI) features or local oxidation of silicon (LOCOS) features. The isolation features may define and isolate the various microelectronic elements. Examples of the various microelectronic elements that may be formed in the substrate 130 include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. Various processes are performed to form the various microelectronic elements including deposition, etching, implantation, photolithography, annealing, and other suitable processes. The microelectronic elements are interconnected to form the integrated circuit device, such as a logic device, memory device (e.g., SRAM), RF device, input/output (I/O) device, system-on-chip (SoC) device, combinations thereof, and other suitable types of devices.

Substrate 130 may be made of a semiconductor wafer, or a portion of wafer. In some embodiments, substrate 130 includes silicon, gallium arsenide, silicon on insulator ("SOI") or other similar materials. In some embodiments, substrate 130 also includes passive devices such as resistors, capacitors, inductors and the like, or active devices such as transistors. In some embodiments, substrate 130 includes additional integrated circuits. Substrates 130 may further include through substrate vias (TSVs) and may be an interposer. In addition, the substrate 130 may be made of other materials. For example, in some embodiments, substrate 130 is a multiple-layer circuit board. In some embodiments, substrate 130 also includes bismaleimide triazine (BT) resin, FR-4 (a composite material composed of woven fiberglass cloth with an epoxy resin binder that is flame resistant), ceramic, glass, plastic, tape, film, or other supporting materials that may carry the conductive pads or lands needed to receive conductive terminals.

Figure 1B:
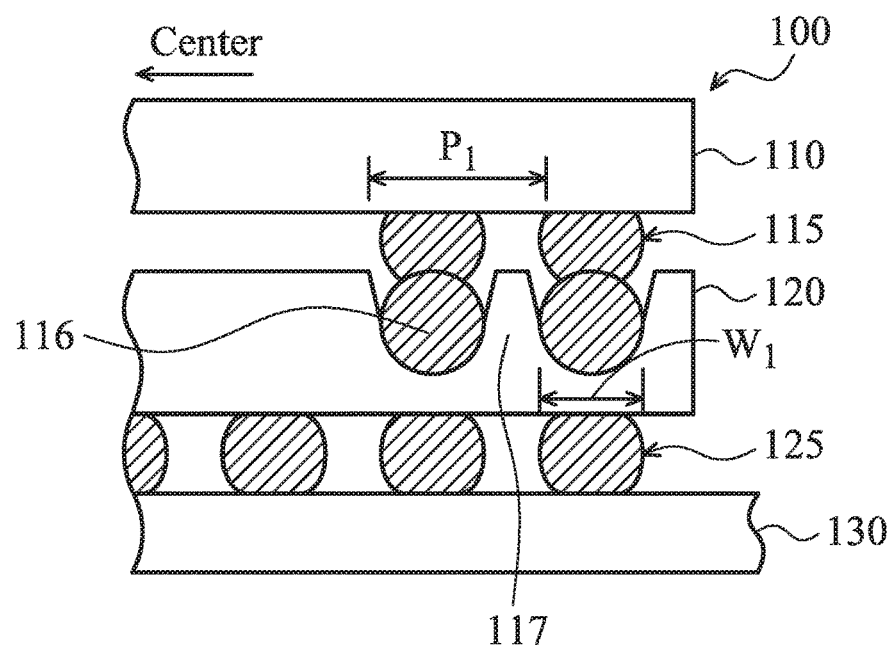
FIG. 1B shows a cross-sectional view of a portion of package of FIG. 1A cut along line P-P, in accordance with some embodiments.

Package 110 is bonded to package 120 via connectors 115, and package 120 is bonded to substrate 130 via connectors 125. FIG. 1B is a cross-sectional view of a portion of the PoP package of FIG. 1A cut along line P-P, in accordance with some embodiments. FIG. 1B shows connectors 115 and 125 near the edge of chip package assembly 100. There are connectors 125 near the center of package 120, in some embodiments. A portion of connectors 115 is formed in openings 116 of package 120. Openings 116 are formed by etching the molding material of package 120. As a result, connectors 115 may also be called through molding vias (TMVs). In some embodiments, the openings 116 are formed by laser drills, and the width $W_1$ of openings 116 is quite large. For example, the width $W_1$ is in a range from about 300 μm to about 600 μm, in accordance with some embodiments. In some embodiments, pitch $P_1$ between two adjacent connectors 115 is in a range from about 400 μm to about 800 μm. The relatively large pitch limits design flexibility and complexity that are needed for advanced devices. In addition, laser drill of openings 116 leaves the isolation regions 117 between connectors 115 relatively thin in the top portions 117', which increase the risk of shorting between connectors 115. Therefore, there is a need of finding alternative mechanisms for forming connectors 115 between package 110 and package 120.

Figure 2A:
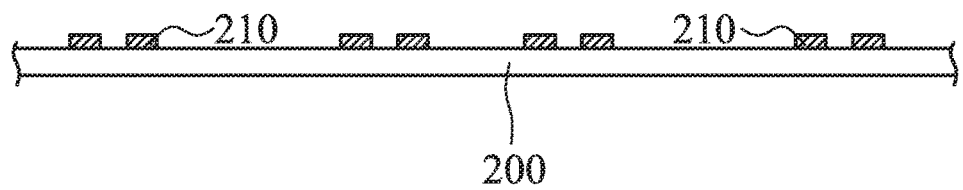
FIGS. 2A-2G are cross-sectional views of a package on package structure at various manufacturing stages, in accordance with some embodiments.

FIGS. 2A-2G are cross-sectional views of a package on package structure at various manufacturing stages, in accordance with some embodiments. FIG. 2A shows a substrate 200 with contact pads 210 for making external connections, in accordance with some embodiments. Substrate 200 may be made of a semiconductor wafer, or a portion of a wafer. In some embodiments, substrate 200 includes silicon, gallium arsenide, silicon on insulator ("SOI") or other similar materials. In some embodiments, substrate 200 also includes passive devices such as resistors, capacitors, inductors and the like, or active devices such as transistors. In some embodiments, substrate 200 includes additional integrated circuits. Substrates 200 may further include through substrate vias (TSVs) and may be an interposer. In addition, the substrate 200 may be made of other materials. For example, in some embodiments, substrate 200 is a multiple-layer circuit board. In some embodiments, substrate 200 also includes bismaleimide triazine (BT) resin, FR-4, FR-5, which is similar to FR-4, ceramic, glass, plastic, tape, film, or other supporting materials that may carry the conductive pads or lands needed to receive conductive terminals. Contact pads 210 are made of conductive material(s) and are connected to interconnect (not shown) in substrate 200.

Figure 2B:
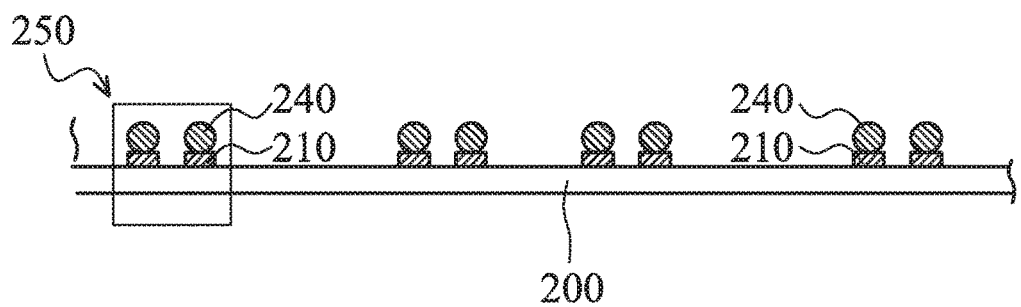
Figure 3A:
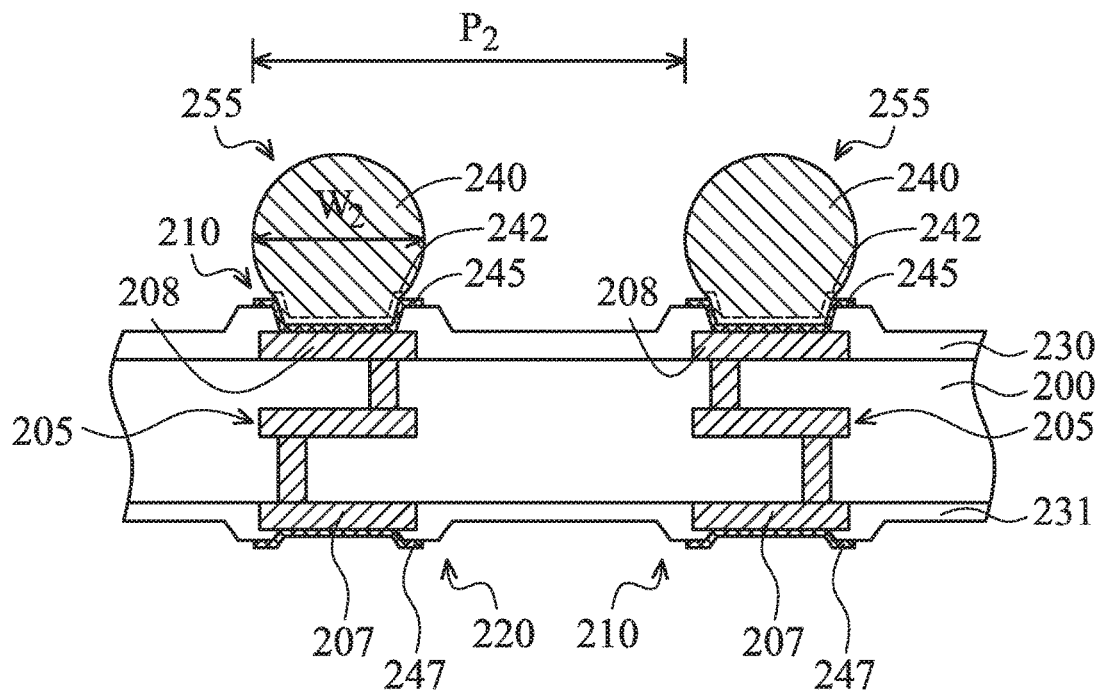
FIGS. 3A-3C are cross-sectional views of bonded metal ball structures, in accordance with some embodiments.

Metal balls 240 are then mounted on contact pads 210 and bond with contact pads 210 to form mounted metal ball structure 255, as shown in FIG. 2B in accordance with some embodiments. The mounting process may involve placing the metal balls 240 on the contact pads 210 and performing a reflow process to bond the contact metal balls 240 to contact pads 210. FIG. 3A is a cross-sectional view of an enlarged region 250 of FIG. 2B, in accordance with some embodiments. FIG. 3A shows region 250 includes substrate 200 and mounted metal ball structure 255, in accordance with some embodiments. Substrate 200 includes interconnect structures 205, which connect to conductive pads 208 and conductive pads 207 on opposite sides of substrate 200, as shown in FIG. 3A in accordance with some embodiments.

In some embodiments, interconnect structures 205 includes the metal lines and vias formed of copper or copper alloys. In some embodiments, interconnect structures 205 are surrounded and insulated by inter-layer dielectrics (ILDs) and/or inter-metal dielectrics (IMDs), which may be made of undoped silicon glass, doped film, low dielectric constant (low-k) dielectric, or combinations thereof. Conductive pads 208 are part of the mounted ball structures 210, in accordance with some embodiments. In some embodiments, conductive pads 208 and 207 comprise aluminum, copper, silver, gold, nickel, tungsten, alloys thereof, and/or multi-layers thereof.

A portion of each of the conductive pads 208 is protected by a passivation layer 230 with the remaining portion of each of the conductive pads 208 exposed. Similarly, conductive pads 207 are also partially protected by a passivation layer 231. Passivation layer 230 and 231 are made of soft (or deformable) dielectric material(s), such as polymers, to relieve bonding stress, in accordance with some embodiments. In some embodiments, additional passivation layer(s) is formed over interconnect structures 205 and at the same level of, or over, conductive pad 208. In some embodiments, the additional passivation layer(s) includes silicon oxide, silicon nitride, un-doped silicate glass (USG), polyimide, or combinations thereof.

An optional bonding layer 245 is formed over the conductive pads 208, in accordance with some embodiments. The optional bonding layer 245 could help bonding metal balls 240 to conductive pads 208. The metal balls 240 are made of non-solder materials, such as copper, aluminum, silver, gold, nickel, tungsten, alloys thereof, and/or multi-layers thereof, in accordance with some embodiments. Metal balls 240 are made of one or more non-solder materials so that they do not deform and short with neighboring metal balls 240 under a thermal process. In some embodiments, the (maximum) width $W_2$ of the metal balls 240 is in a range from about 100 μm to about 200 μm. In some embodiments, the pitch $P_2$ of metal balls 240 is in a range from about 150 μm to about 300 μm.

As mentioned above, the bonding layer 245 could be used to improve bonding between conductive pads 208 and metal balls 240. For example, if both the conductive pads 208 and metal balls 240 are made of copper, the bonding layer 245 may be made of solder, which can be used to bond copper to copper. In some embodiments, the bonding layer 245 is made of solder or solder alloy such as Sn—Ag, Sn—Ag—Cu, Sn—Bi, Sn—Cu, etc. In some embodiments, bonding layer 245 is made of solder alloy including Sn, Pb, Ag, Cu, Ni, bismuth (Bi), or combinations thereof.

In some embodiments, the (optional) bonding layer 245 includes two sub-layers. For example, the two sub-layers may include a solder-containing layer over a protective layer, such as a layer of Ti and/or Ni. The protective layer is placed between the solder-containing layer and conductive pads 208. The protective layer could prevent the oxidation of copper-containing metal balls 240 and improves the wetting of metal balls 240. In some embodiments, the thickness of the bonding layer 245 is in a range from about 0.5 μm to about 10 μm.

After metal balls 240 are placed on the bonding layer 245, a reflow process is performed to bond the metal balls 240 to the conductive pads 208 with the help of the bonding layer 245. For example, if the metal balls 240 and the conductive pads 208 are made of copper or copper alloy, a bonding layer 245 made of solder would help bond the copper containing metal balls 240 and conductive pads 208 together. In some embodiments, the reflow temperature is in a range from about 180° C. to about 240° C. After the reflow process, the metal balls 240 are bonded to (or mounted on) the conductive pads 208 to form mounted metal ball structure 255. In at least one embodiment, conductive pads 208, bonding layer 245 and metal balls 240 form the mounted metal ball structures 255, in accordance with some embodiments. If the metal balls 240 include copper and the bonding layer 245 includes solder, an inter-metal compound (IMC) layer 242 may be formed between the metal balls 240 and the bonding layer 245. As mentioned above, a solder-containing bonding layer 245 could include a stable film over the solder to prevent the formation of the IMC layer 242.

The conductive pads 207 may be covered by a bonding layer 247 in accordance with some embodiments. Each of the conductive pads 207 and accompanying bonding layer 247 form a connecting structure 220, which is used to bond with an external connector (not shown), in accordance with some embodiments. In some embodiments, the bonding layer 247 is not needed. For example, if the external connectors (not shown) are made of solder and the conductive pads 207 are made of copper, the bonding layer 247 is not needed for bonding. In some embodiments, the bonding layer 247 is made of the same material as bonding layer 245. In some embodiments, the bonding layer 247 is made of a material different from that of bonding layer 245. The existence and choice of the material(s) for bonding layer 247 depend on the material of conductive pads 207 and the external connectors (not shown) to be bonded to the conductive pads 207.

Figures 3B, 3C:
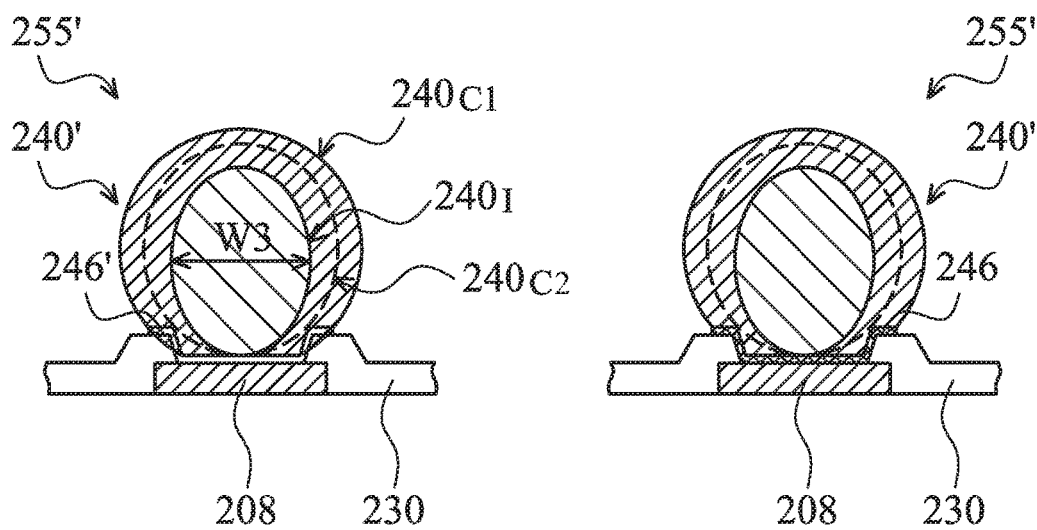

FIG. 3B shows mounted metal ball structure 255', in accordance with some other embodiments. The metal balls 240' bonded to a conductive pad 208 includes an inner metal ball $240_I$ and one or more coating layers, such as coating layer $240_{C1}$ and optional intermediate layer $240_{C2}$, in accordance with some embodiments. The inner metal balls $240_I$ are similar to metal balls 240 and may be made of various materials described above. In some embodiments, the width $W_3$ of the inner metal balls $240_I$ is in a range from about 100 μm to about 250 μm. The coating layer(s) is used to improve bonding between the metal balls 240' and conductive pads 208. In some embodiments, the coating layer(s) replaces the bonding layer 245 described in FIG. 3A, in accordance with some embodiments. For example, if the inner metal balls $240_I$ are made of copper or copper alloy and conductive pads 208 are made of copper, a solder-containing coating layer $240_{C1}$ would help bond the inner metal balls $240_I$ to conductive pads 208. In some embodiments, the manufacturing of coating the inner metal balls $240_I$ would be simpler than forming a bonding layer 245, which involves deposition of the bonding layer 245 and removing of excess bonding layer 245 away from conductive pads 208. Removing the excess bonding layer 245 could involve patterning of the bonding layer and an etching process to remove excess bonding layer 245. In some embodiments, the coating layer $240_{C1}$ is made of materials similar to materials for bonding layer 245. In some embodiments, the thickness of coating layer $240_{C1}$ is in a range from about 0.5 μm to about 10 μm. Even with the coating layer, metal balls 240' would deform much less under reflow than solder balls. As a result, metal balls 240' are less likely to short to each other after reflow. The ranges of width and pitch of metal balls 240' are similar to those of metal balls 240.

In some embodiments, an intermediate layer $240_{C2}$ is formed between the inner metal balls $240_I$ and coating layer $240_{C1}$. The intermediate layer $240_{C2}$ is conductive and prevents the formation of inter-metal compound (IMC) between the inner metal balls $240_I$ and coating layer $240_{C1}$ during and after the reflow process for bonding the metal balls 240' with the conductive pads 208 in accordance with some embodiments. For example, if the inner metal balls $240_I$ include copper and the coating layer $240_{C1}$ includes solder, an intermediate layer $240_{C2}$ made of a metal or alloy inert to copper and solder under reflow condition would prevent forming IMC between the inner metal balls $240_I$ and the coating layer $240_{C1}$. In some embodiments, the intermediate layer $240_{C2}$ includes Ti and/or Ni. In some embodiments, the thickness of intermediate layer $240_{C2}$ is in a range from about 0.5 μm to about 10 μm.

In some embodiments, a temporary protective layer 246' is formed over conductive pads 208 as shown in FIG. 3B. The temporary protective layer 246' may prevent the oxidation of the conductive pads 208 during transport. For example, the temporary protective layer 246' is made of an organic material, which would evaporate under reflow temperature to allow the metal balls 240' to come in contact with conductive pads 208. In some embodiments, the protective layer 246 is made of an organic solderability preservative (OSP), which is a polymer. For example, the OSP may be organic azole based.

In some embodiments, a protective layer 246 is formed over conductive pads 208 as shown in FIG. 3C. The protective layer 246 may prevent the oxidation of the conductive pads 208 during transport. For example, if the conductive pads 208 include copper, the proactive layer 246 may be made of a stable metal, such as Ti, Ni, Au, Ag, a combination thereof, or alloy thereof. In some embodiments, the thickness of the temporary protective layer 246' or the protective layer 246 is in a range from about 0.5 μm to about 10 μm.

Figure 4:
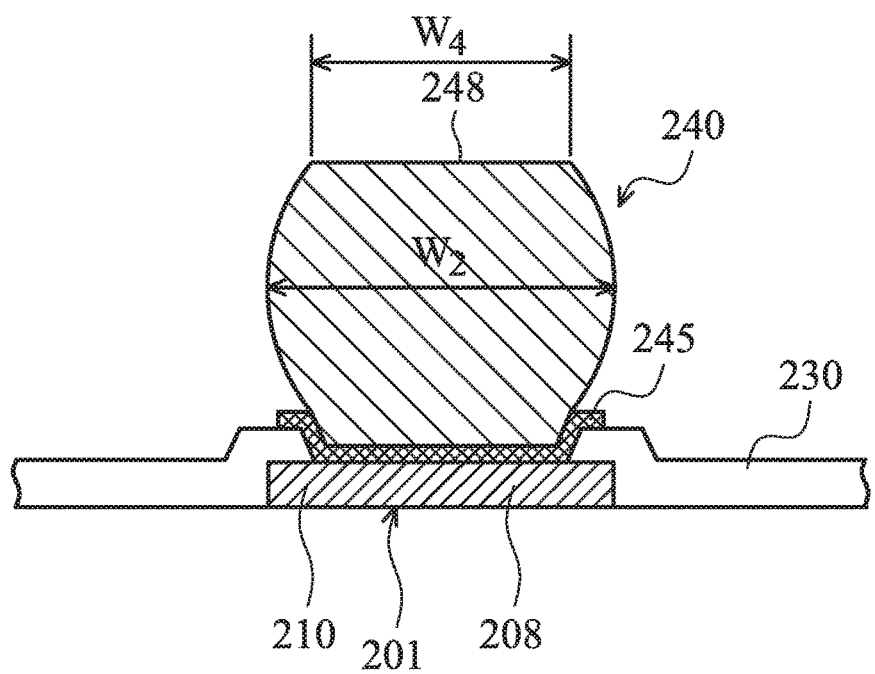
FIG. 4 is a cross-sectional view of a bonded metal ball structure after the top surface of a metal ball is flattened, in accordance with some embodiments.

In some embodiments, the top surface of the metal balls 240 or 240' is flattened to improve the contact between the connectors (not shown) to be bonded to metal balls 240 or 240'. FIG. 4 shows a bonded metal ball structure after a top surface of metal ball 240 is flattened, in accordance with some embodiments. The flattened surface 248 is substantially parallel to surface 201 of substrate 200, in accordance with some embodiments. Weight can be applied over a plate placed over metal balls 240 to flatten the top surface. In some embodiment the width $W_4$ of the flat portion is in a range from about 20 μm to about 100 μm. In some embodiments, the ratio of width $W_4$ to the width $W_2$ of the metal balls 240 is in a range from about 20% to about 80%. However, the flattening process optional. It might not be needed in some embodiments.

Figure 2C:
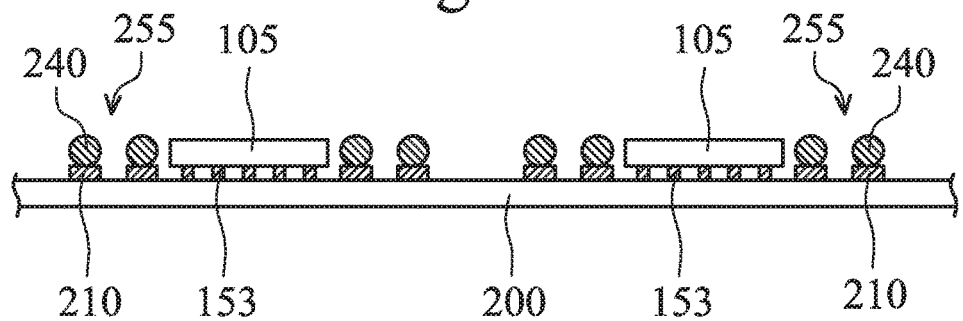

After metal balls 240 or 240' are bonded (or mounted) and optionally flattened on the conductive pads 208, semiconductor dies 105 are placed on substrate 200 as shown in FIG. 2C in accordance with some embodiments. Each semiconductor die 105 is placed between metal balls 240. To simplify description, only metal balls 240 are used from hereon. However, the following description is applicable to metal balls 240' described above as well. In some embodiments, a reflow process is performed to bond the connectors (not shown) on semiconductor dies 105 to contact pads (not shown) on substrate 200 to form bonding structures 153.

Each semiconductor die 105 includes a substrate as employed in a semiconductor integrated circuit fabrication, and integrated circuits may be formed therein and/or thereupon. The semiconductor substrate is defined to mean any construction comprising semiconductor materials, including, but not limited to, bulk silicon, a semiconductor wafer, a silicon-on-insulator (SOI) substrate, or a silicon germanium substrate. Other semiconductor materials including group III, group IV, and group V elements may also be used.

Examples of the various microelectronic elements that may be formed in the semiconductor dies 105 include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. Various processes are performed to form the various microelectronic elements including deposition, etching, implantation, photolithography, annealing, and other suitable processes. The microelectronic elements are interconnected to form the integrated circuit device, such as a logic device, memory device (e.g., SRAM), RF device, input/output (I/O) device, system-on-chip (SoC) device, combinations thereof, and other suitable types of devices.

Figure 5:
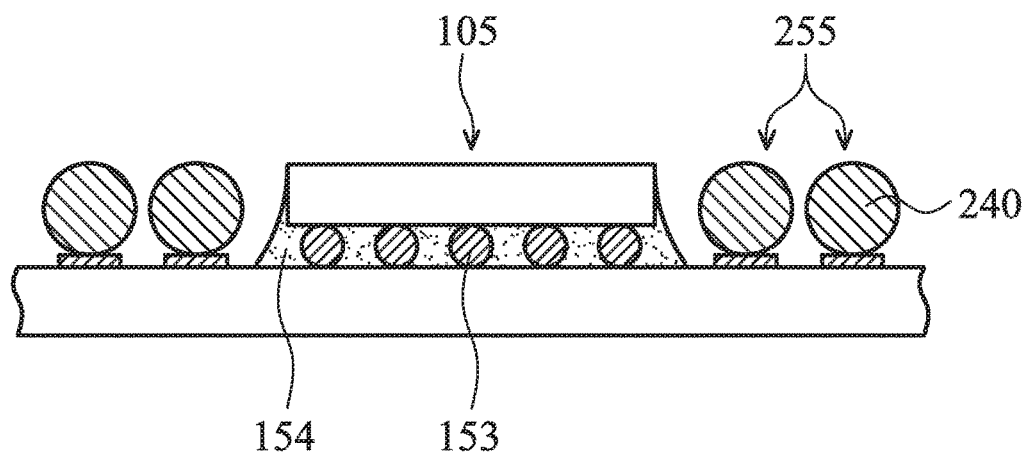
FIG. 5 is a cross-sectional view of a semiconductor die bonded to a substrate filled with an underfill in the space between the semiconductor die and the substrate, in accordance with some embodiments.

In some embodiments, an underfill 154 fills the space between semiconductor dies 105 and substrate 200 as shown in FIG. 5. Underfill 154 provides support for semiconductor dies 105 and prevents cracking of solder joints (not shown) on bonding structures 153 electrically connecting the semiconductor dies 105 and conductive elements (interconnect) in substrate 200. However, forming underfill 154 after semiconductor dies 105 being bonded to substrate 200 is optional. In some embodiments, underfill 154 is not formed. Underfill 154 may be made of thermosetting polymers, in accordance with some embodiments. For example, Underfill 154 may be made of (or include) epoxy resin (amine type, phenol type, anhydrates types, etc.), silicon fillers, curing agents, addictives and/or hardener.

Figure 2D:
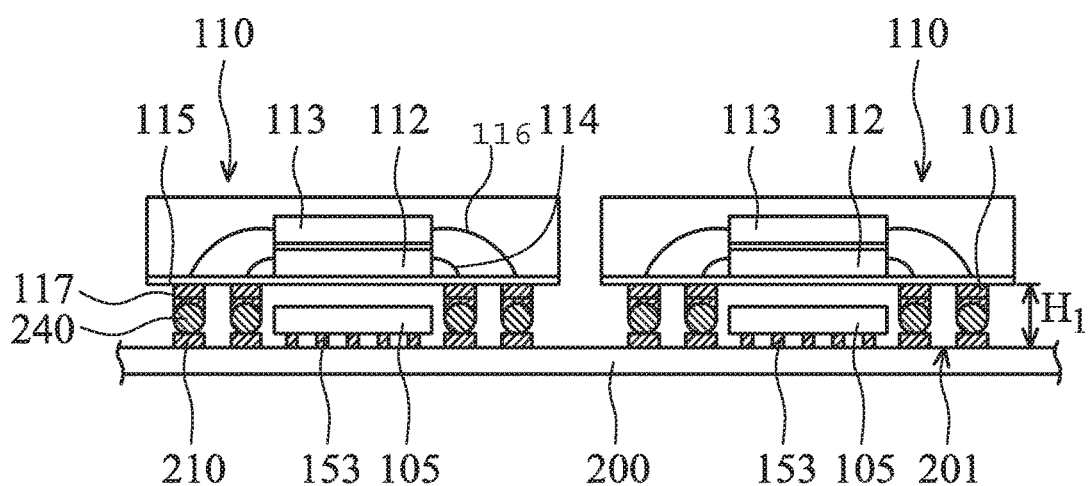

Afterwards, packages 110 are placed above substrate 200 and are mounted on metal balls 240, as shown in FIG. 2D in accordance with some embodiments. Each package 110 includes two semiconductor dies 112 and 113, with die 113 disposed over die 112, in accordance with some embodiments. However, package 110 could include one semiconductor die or more than two semiconductor dies. In some embodiments, there is a glue layer (not shown) between dies 112 and 113. Semiconductor dies 112 and 113 may include various microelectronic elements, as described above for semiconductor dies 105. The examples of these various microelectronic elements have been described above. Semiconductor die 112 is bonded to a substrate 115. Substrate 115 may include various materials and/or components described above for the substrate of semiconductor die 105. Semiconductor die 112 is electrically connected to conductive elements (not shown) in substrate 115 via bonding wires 114, in accordance with some embodiments. Similarly, semiconductor die 113 is electrically connected to the conductive elements in substrate 115 via bonding wires 116. Package 110 also includes a molding compound 111, which covers semiconductor dies 112 and 113, and also bonding wires 114 and 116.

Each package 110 includes a number of connectors 117 surrounding semiconductor die 105, in accordance with some embodiments. Connectors 117 are made of a conductive material, such as solder, solder alloy, etc. Connectors 117 are formed on conductive structures (not shown) on the surface of substrate 115 to electrically connect to elements in substrate 115. After package 110 is placed over substrate 200 with connectors 117 of package 110 in contact with metal balls 240, a reflow process is performed to bond the connectors 117 to metal balls 240, in accordance with some embodiments. After the connectors 117 are bonded to metal balls 240 to form bonding structures 118, packages 110 are considered "mounted" on substrate 200. Due to the non-solder metal balls 240, the height of the bonding structures 118 can be controlled more consistently. In some embodiments, the height $H_1$ between a top surface 201 of substrate 200 and the bottom surface 101 of package 110 (or substrate 115) is in a range from 100 μm to about 250 μm.

Figure 2E:
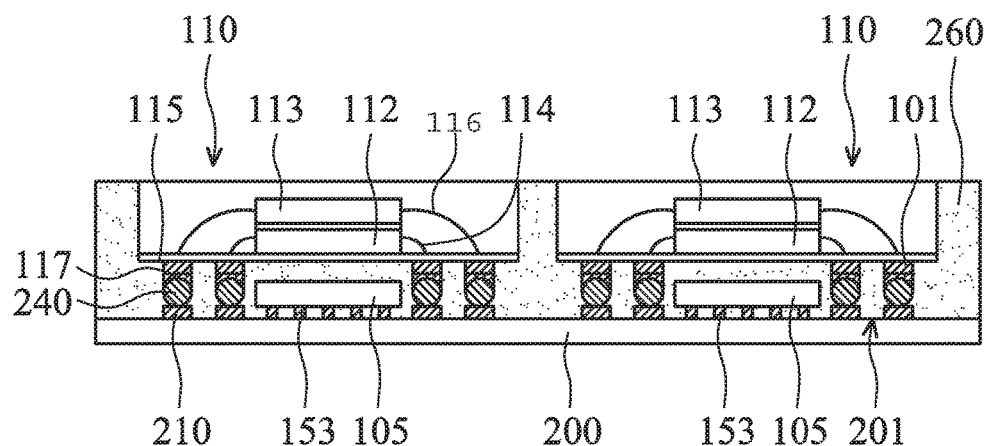

After packages 110 are mounted on substrate 200, a molded underfill (MUF) 260 is applied on substrate 200 to fill the space between packages 110 and between packages 110 and substrate 200, as shown in FIG. 2E in accordance with some embodiments. In some embodiments, the MUF 260 has fillers. The MUF 260 supports packages 110 and prevents cracking of solder joints on bonding structures 118 and between metal balls 240 and conductive pads 208. Further, MUF 260 could also prevent the bending (deformation) of package on package structures on substrate 200 due to mismatch of coefficients of thermal expansion (CTE) of materials on substrate 200 after thermal cycling. In some embodiments, MUF 260 is made of epoxy resin (amine type, phenol type, anhydrates types, etc.), silicon fillers, curing agents, additives and/or hardener materials. If there is no underfill 154 underneath semiconductor dies 105, MUF 260 also fills the space between semiconductor dies 105 and substrate 200 to protect bonding structures 153. Processing cost could be saved by using 260 to fill the space packages 110 and substrate 200 and simultaneously filling the space between semiconductor dies 105 and substrate 200.

Figure 2F:
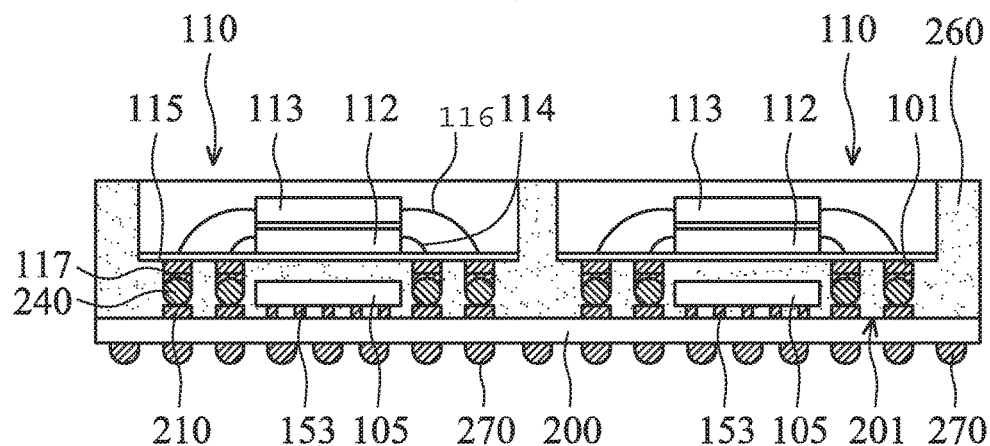

After the MUF forming process, connectors 270 are bonded to conductive pads 207 (not shown) on the other side (opposite from packages 110) of substrate 200, as shown in FIG. 2F in accordance with some embodiments. Connectors 270 are made of conductive materials. They could be solder, solder alloy, copper, copper alloy, gold, or gold alloy, etc. As mentioned above, there could be a bonding layer 247 covering conductive pads 207. The connectors 270 are bonded to the conductive pads 207 by a reflow process.

Figure 2G:
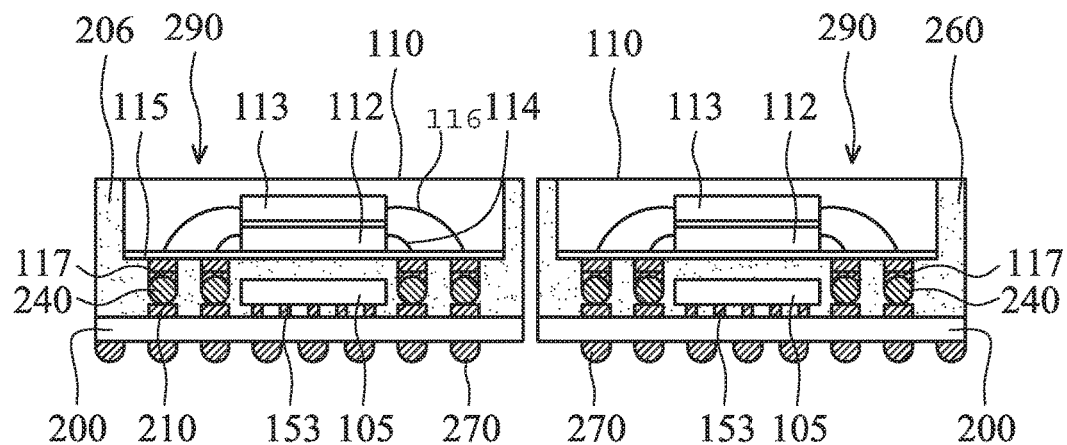

After connectors 270 are bonded to the opposite side of substrate 200 from packages 110, substrate 200 with bonded multiple packages 110 and semiconductor die 105 is singulated (or sawed) into individual packages, each of which has a package 110 and a semiconductor die 105. FIG. 2G shows substrate 200 after it is singulated into individual package 290, in accordance with some embodiments. Each individual package 290 is a package on package structure and has a package 110 and a semiconductor die 105, in accordance with some embodiments.

Figure 6A:
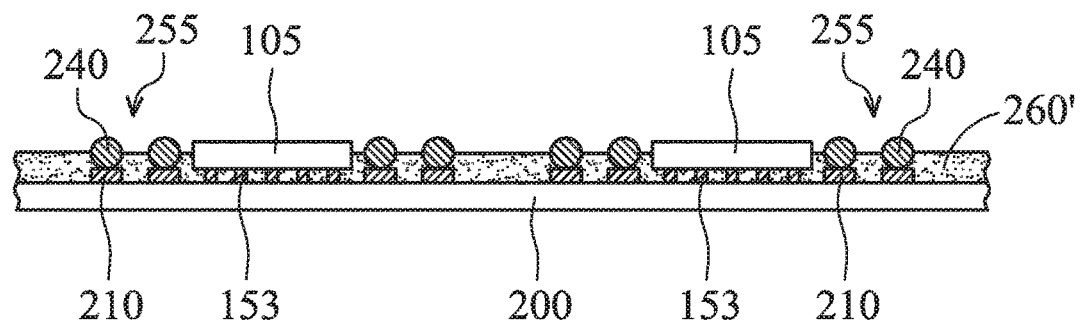
FIGS. 6A-6D are cross-sectional views of a package on package structure at various manufacturing stages, in accordance with some embodiments.

The embodiments described above in FIGS. 2A-2G and 3-5 of forming package 290 of package on package (PoP) structure involves MUF 260. In some alternative embodiments, an exposed die molding underfill (eMUF) 260' is formed on substrate with the top portions of semiconductor die 105 and metal balls 240 exposed, as shown in FIG. 6A in accordance with some embodiments. After semiconductor dies 105 are placed on and bonded to substrate 200 as shown in FIG. 2C described above, eMUF 260' is formed over substrate 200. By forming the exposed eMUF 260', there is an air gap 285 between each package 110 and semiconductor die 105. The air gap 285 allows chips, such as chips 112 and 113, on package 110 to be substantially thermally isolated from semiconductor die 105. As a result, heat generated from chips 112 and 113, which are in proximity of semiconductor die 105, is less likely to be transferred to semiconductor die 105, and vice versa. The eMUF 260' still can protect the solder joints between metal balls 240 and conductive pads 208. The eMUF 260' also can help reducing the bending of substrate 200 before singulation and formed packages after singulation due to mismatch of CTEs.

Figure 6B:
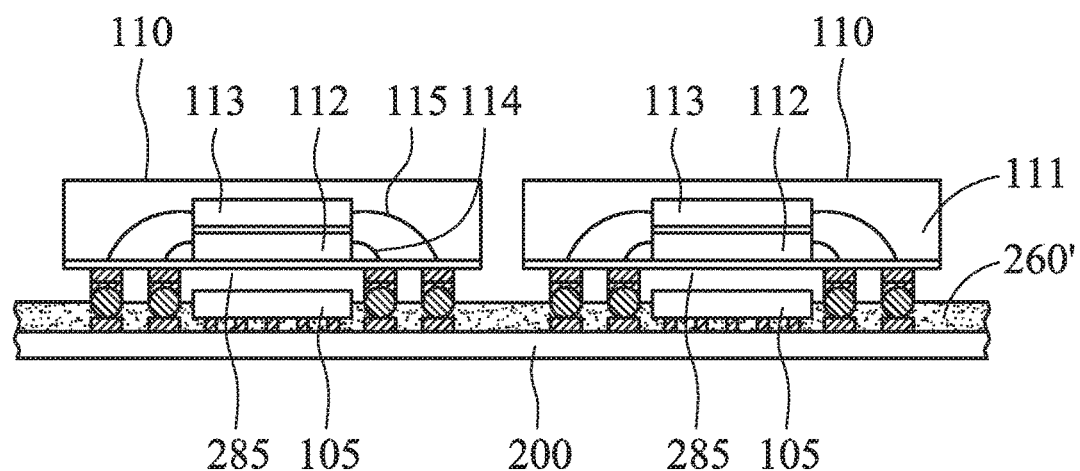
Figure 6C:
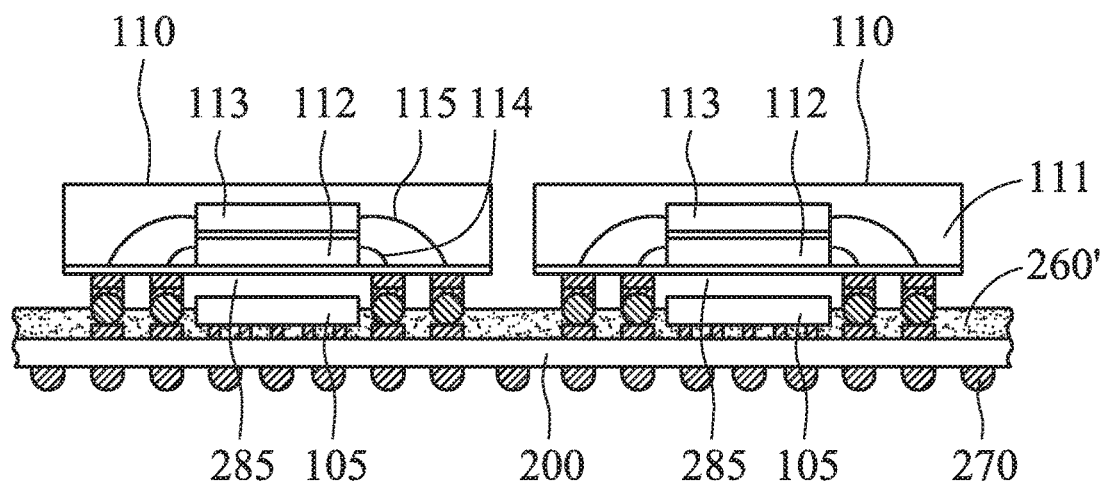
Figure 6D:
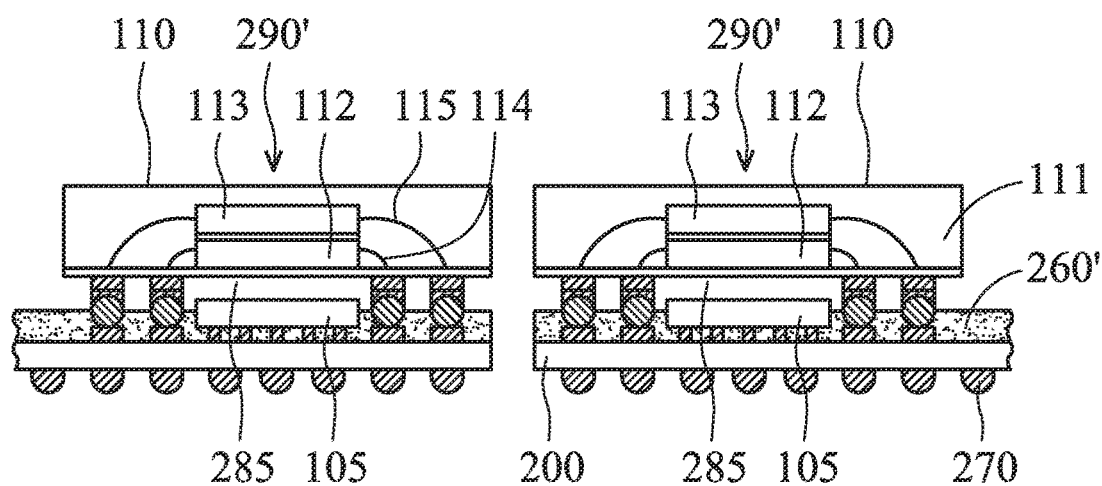

After the eMUF 260' is formed on substrate 200 as described above, packages 110 are bonded to substrate 200, as shown in FIG. 6B in accordance with some embodiments. The bonding of packages 110 to substrate 200 has been described above. Connectors 270 are then attached to substrate 200 in a similar manner described above in FIG. 2F, in accordance with some embodiment. FIG. 6C shows connectors 270 bonded to substrate 200, in accordance with some embodiments. Substrate 200 with packages 110 and semiconductor dies 105 is then singulated into individual packages 290', as shown in FIG. 6D in accordance with some embodiments. FIGS. 2A-2C and 6A-4D show cross-sectional views of packaging structures in sequential process flow of forming a package on package structure, in accordance with some embodiments.

The described embodiments of mechanisms of forming a package on package (PoP) structure involve bonding with connectors with non-solder metal balls to a packaging substrate. The non-solder metal balls may include a solder coating layer. The connectors with non-solder metal balls can maintain substantially the shape of the connectors and control the height of the bonding structures between upper and lower packages. The connectors with non-solder metal balls are also less likely to result in bridging between connectors or disconnection (or cold joint) of bonded connectors. As a result, the pitch of the connectors with non-solder metal balls can be kept small.

In some embodiments, a semiconductor device package includes a substrate with a contact pad. A semiconductor die is bonded to the contact pad by a first bonding structure. The first bonding structure includes a metal ball comprising a non-solder material, a solder layer over a surface of the non-solder material, and an intermediate layer between the solder layer and the non-solder material. The intermediate layer is configured to prevent formation of an intermetallic compound between the metal ball and the solder layer. The non-solder material includes copper, aluminum, silver, gold, nickel, tungsten, alloys thereof, or combinations thereof, and the intermediate layer comprises titanium.

In some other embodiments, an apparatus includes a substrate and a package that includes a first semiconductor die surrounded by a molding compound. The first semiconductor die of the package is bonded to the substrate by a first conductive bonding structure. The first conductive bonding structure includes a metal ball made of non-solder material, a layer of solder over a surface of the metal ball, and an intermediate layer between the metal ball and the layer of solder. The intermediate layer is distinct from both the metal ball and the layer of solder and is configured to prevent formation of an intermetallic compound between the metal ball and the layer of solder.

Still some other embodiments relate to a solder ball for coupling circuit components. The solder ball includes a metal ball made of non-solder material, a layer of solder over a surface of the metal ball, and an intermediate layer between the metal ball and the layer of solder. The intermediate layer is distinct in composition from both the metal ball and the layer of solder.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device package, comprising:
   a substrate with a contact pad;
   a non-solder ball coupled to the contact pad at a contact pad interface surface, wherein the non-solder ball is arranged over and electrically coupled to the contact pad;
   a layer of solder over an outer surface of the non-solder ball, the layer of solder having an inner surface and an outer surface which are generally concentric with the outer surface of the non-solder ball; and
   an intermediate layer separating the non-solder ball and the layer of solder, wherein the intermediate layer is distinct in composition from the non-solder ball and the layer of solder, wherein the intermediate layer has a first annular thickness on a first portion of the non-solder ball between the non-solder ball and the contact pad and has a second annular thickness on a second portion of the non-solder ball, the second annular thickness being greater than the first annular thickness; and
   wherein sidewalls of the layer of solder are curved or sphere-like and terminate at a planar surface corresponding to a maximum height for the layer of solder, the maximum height being measured from the contact pad interface surface.

2. The semiconductor device package of claim 1, wherein the non-solder ball includes copper, aluminum, silver, gold, nickel, tungsten, alloys thereof, or combinations thereof, and the intermediate layer comprises titanium.

3. The semiconductor device package of claim 1, wherein the semiconductor device package has another non-solder ball next to the non-solder ball, and a pitch of the non-solder ball and the another non-solder ball is in a range from about 150 μm to about 300 μm.

4. The semiconductor device package of claim 1, wherein the layer of solder is a continuous layer that coats the intermediate layer.

5. The semiconductor device package of claim 1, wherein the layer of solder has a thickness in a range from 0.5 μm to about 10 μm.

6. The semiconductor device package of claim 1, wherein the intermediate layer has a thickness ranging from about 0.5 μm to about 10 μm.

7. The semiconductor device package of claim 1, wherein the intermediate layer is a continuous layer that coats an outer surface of the non-solder ball.

8. A semiconductor device package, comprising:
   a substrate with a contact pad;

a non-solder ball coupled to the contact pad at a contact pad interface surface;

a layer of solder over an outer surface of the non-solder ball, the layer of solder having an inner surface and an outer surface which are generally concentric with the outer surface of the non-solder ball; and an intermediate layer separating the non-solder ball and the layer of solder, wherein the intermediate layer is distinct in composition from the non-solder ball and the layer of solder; and wherein the intermediate layer is elongated along an axis that is perpendicular to the contact pad interface surface, such that the intermediate layer has a height as measured from the contact pad interface surface to an uppermost extent of the intermediate layer along the axis, and has a diametric width between its outermost sidewalls, the diametric width being less than the height.

9. The semiconductor device package of claim 8, wherein the intermediate layer is distinct from both the non-solder ball and the layer of solder and is configured to prevent formation of an intermetallic compound between the non-solder ball and the layer of solder.

10. The semiconductor device package of claim 8, further comprising:

a molded underfill on the substrate.

11. The semiconductor device package of claim 8, wherein the intermediate layer comprises titanium, and wherein material of the non-solder ball includes copper, aluminum, silver, gold, nickel, tungsten, alloys thereof, or combinations thereof.

12. The semiconductor device package of claim 8, wherein the layer of solder and the intermediate layer are generally concentric, and the non-solder ball is arranged over and electrically coupled to the contact pad, wherein the intermediate layer has a first annular thickness on a first portion of the non-solder ball between the non-solder ball and the contact pad and has a second annular thickness on a second portion of the non-solder ball, the second annular thickness being greater than the first annular thickness.

13. A semiconductor device package, comprising:

a substrate with a contact pad;

a metal ball bonded to the contact pad to form a first bonding structure, wherein the metal ball comprises a non-solder material, wherein the bonded metal ball includes a solder layer over a surface of the non-solder material and an intermediate layer between the solder layer and the non-solder material, and the intermediate layer is configured to prevent formation of an intermetallic compound, and wherein the intermediate layer is a continuous layer that coats an outer surface of the metal ball and has different annular thicknesses at different locations along the outer surface of metal ball;

a semiconductor die bonded to the substrate, wherein the semiconductor die is disposed next to the first bonding structure;

a die package, having a connector, bonded to a surface of the substrate bonded with the semiconductor die, wherein a second bonding structure is formed between the connector on the die package and the metal ball bonded to the substrate; and a molded underfill on the substrate.

14. The semiconductor device package of claim 13, wherein the solder layer and the intermediate layer are generally concentric with one another, and the metal ball is arranged over and electrically coupled to the contact pad, wherein the intermediate layer has a first annular thickness on a first portion of the metal ball between the metal ball and the contact pad and has a second annular thickness on a second portion of the metal ball, the second annular thickness being greater than the first annular thickness.

15. The semiconductor device package of claim 13 wherein the solder layer is a continuous layer that coats an outer surface of the intermediate layer.

16. The semiconductor device package of claim 13, wherein a width or diameter of the metal ball is in a range from about 100 μm to about 200 μm.

17. The semiconductor device package of claim 13, wherein the solder layer has a thickness in a range from 0.5 μm to about 10 μm.

18. The semiconductor device package of claim 13, wherein the intermediate layer has a thickness ranging from about 0.5 μm to about 10 μm.

19. The semiconductor device package of claim 1, wherein the non-solder ball, the layer of solder, and the intermediate layer together have a first maximum width, measured parallel to an upper surface of the substrate and between two points on an outer surface of the sidewalls of the layer of solder; and wherein the planar surface corresponding to a maximum height for the layer of solder has a second maximum width that is smaller than the first maximum width.

20. The semiconductor device package of claim 13, wherein the metal ball physically contacts the contact pad.

* * * * *